United States Patent
Nakazawa (10) Patent No.: US 11,811,388 B2
(45) Date of Patent: Nov. 7, 2023

(54) ACOUSTIC WAVE DEVICE (71) Applicant: Murata Manufacturing Co., Ltd., Nagaokakyo (JP)

(72) Inventor: Hidetaro Nakazawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 330 days.

(21) Appl. No.: 17/326,385

(22) Filed: May 21, 2021

(65) Prior Publication Data

US 2021/0328572 A1  Oct. 21, 2021

Related U.S. Application Data (63) Continuation of application No. PCT/JP2019/042190, filed on Oct. 28, 2019.

(30) Foreign Application Priority Data

Dec. 13, 2018  (JP) .................................. 2018-233247

(51) Int. Cl.
 *H03H 9/02* (2006.01)
 *H03H 9/145* (2006.01)
 (Continued)

(52) U.S. Cl.
 CPC .... *H03H 9/02992* (2013.01); *H03H 9/14552* (2013.01); *H03H 9/54* (2013.01); *H03H 9/64* (2013.01)

(58) Field of Classification Search
 CPC .. H03H 9/02992; H03H 9/14552; H03H 9/54; H03H 9/64
 (Continued)

(56) References Cited

U.S. PATENT DOCUMENTS

2002/0153970 A1  10/2002  Noto
2017/0170808 A1* 6/2017  Iwaki ................. H03H 9/14532
(Continued)

FOREIGN PATENT DOCUMENTS

JP  2002-314366 A  10/2002
JP  2007-235711 A   9/2007
(Continued)

OTHER PUBLICATIONS

Machine Translation of WO2017187724A1 provided from espacenet. com, https://worldwide.espacenet.com/patent/search/family/060161262/publication/WO2017187724A1?q=WO2017%2F187724, translated Jun. 12, 2023 (Year: 2017).*

(Continued)

*Primary Examiner* — Samuel S Outten
(74) *Attorney, Agent, or Firm* — KEATING & BENNETT, LLP (57) ABSTRACT

An acoustic wave device includes a piezoelectric substrate and an IDT electrode on the piezoelectric substrate. The IDT electrode includes a first comb-shaped electrode including first electrode fingers and a second comb-shaped electrode including second electrode fingers. The IDT electrode includes a first portion in which a main electrode layer includes a first metal and a second portion in which a main electrode layer includes a second metal. The first electrode fingers and the second comb-shaped electrode include first facing portions facing each other with a gap in between, and the second electrode fingers and the first comb-shaped electrode include second facing portions facing each other with a gap in between. At least one of the first facing portions and second facing portions is the second portion, and a portion of the IDT electrode other than the second portion is the first portion.

20 Claims, 5 Drawing Sheets

(51) Int. Cl.
*H03H 9/54* (2006.01)
*H03H 9/64* (2006.01)

(58) Field of Classification Search
USPC .......................................... 333/193
See application file for complete search history.

(56) References Cited

U.S. PATENT DOCUMENTS

2017/0373669 A1  12/2017  Iwaki et al.
2019/0334500 A1  10/2019  Horikawa

FOREIGN PATENT DOCUMENTS

JP   2017-228945 A    12/2017
WO   WO-2017187724 A1 * 11/2017
WO   2018/131454 A1   7/2018

OTHER PUBLICATIONS

Official Communication issued in International Patent Application No. PCT/JP2019/042190, dated Dec. 17, 2019.

* cited by examiner

ACOUSTIC WAVE DEVICE

CROSS REFERENCE TO RELATED APPLICATIONS

This application claims the benefit of priority to Japanese Patent Application No. 2018-233247 filed on Dec. 13, 2018 and is a Continuation Application of PCT Application No. PCT/JP2019/042190 filed on Oct. 28, 2019. The entire contents of each application are hereby incorporated herein by reference.

BACKGROUND OF THE INVENTION

1. Field of the Invention

The present invention relates to an acoustic wave device.

2. Description of the Related Art

An acoustic wave device has been used for a filter of a mobile phone or the like. Japanese Unexamined Patent Application Publication No. 2002-314366 discloses an example of an acoustic wave device. In the acoustic wave device, an interdigital transducer (IDT) electrode is provided on a $LiTaO_3$ substrate. The IDT electrode is made of an Al—Cu alloy. Electrode fingers of the IDT electrode are uniformly made of a same material.

In recent years, there has been a demand for further improvement in a filter characteristic of an acoustic wave device. However, in the acoustic wave device described in Japanese Unexamined Patent Application Publication No. 2002-314366, it is difficult to sufficiently suppress intermodulation distortion (IMD).

SUMMARY OF THE INVENTION

Preferred embodiments of the present invention provide acoustic wave devices that are each capable of effectively reducing or preventing IMD.

An acoustic wave device according to a preferred embodiment the present invention includes a piezoelectric substrate and an IDT electrode on the piezoelectric substrate. The IDT electrode includes a first comb-shaped electrode and a second comb-shaped electrode each of which includes a main electrode layer. The first comb-shaped electrode includes a first busbar and a plurality of first electrode fingers with one end connected to the first busbar, and the second comb-shaped electrode includes a second busbar and a plurality of second electrode fingers with one end connected to the second busbar and interdigitated with the plurality of first electrode fingers. The IDT electrode includes a first portion in which the main electrode layer includes a first metal and a second portion in which the main electrode layer includes a second metal. The plurality of first electrode fingers and the second comb-shaped electrode include first facing portions facing each other with a gap in between, and the plurality of second electrode fingers and the first comb-shaped electrode include second facing portions facing each other with a gap in between. At least any of the first facing portion of the plurality of first electrode fingers, the first facing portion of the second comb-shaped electrode, the second facing portion of the plurality of second electrode fingers, and the second facing portion of the first comb-shaped electrode is the second portion, and a portion of the IDT electrode other than the second portion is the first portion. The density of the second metal is higher than the density of the first metal.

An acoustic wave device according to a preferred embodiment of the present invention includes a piezoelectric substrate and an IDT electrode on the piezoelectric substrate. The IDT electrode includes a first comb-shaped electrode and a second comb-shaped electrode each of which includes a main electrode layer. The first comb-shaped electrode includes a first busbar and a plurality of first electrode fingers with one end connected to the first busbar, and the second comb-shaped electrode includes a second busbar and a plurality of second electrode fingers with one end connected to the second busbar and interdigitated with the plurality of first electrode fingers. The IDT electrode includes a first portion in which the main electrode layer includes a first metal and a second portion in which the main electrode layer includes a second metal. The plurality of first electrode fingers and the second comb-shaped electrode include first facing portions facing each other with a gap in between, and the plurality of second electrode fingers and the first comb-shaped electrode include second facing portions facing each other with a gap in between. At least any of the first facing portion of the plurality of first electrode fingers, the first facing portion of the second comb-shaped electrode, the second facing portion of the plurality of second electrode fingers, and the second facing portion of the first comb-shaped electrode is the second portion, and a portion of the IDT electrode other than the second portion is the first portion. A Young's modulus of the second metal is higher than Young's modulus of the first metal.

According to preferred embodiments of the present invention, it is possible to provide acoustic wave devices that are each capable of effectively reducing or preventing IMD.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing preferred embodiments of the present invention with reference to the accompanying drawings.

It should be noted that the preferred embodiments described in the specification are merely examples and that a partial replacement or a combination of configurations is possible between different preferred embodiments.

Figure 1:
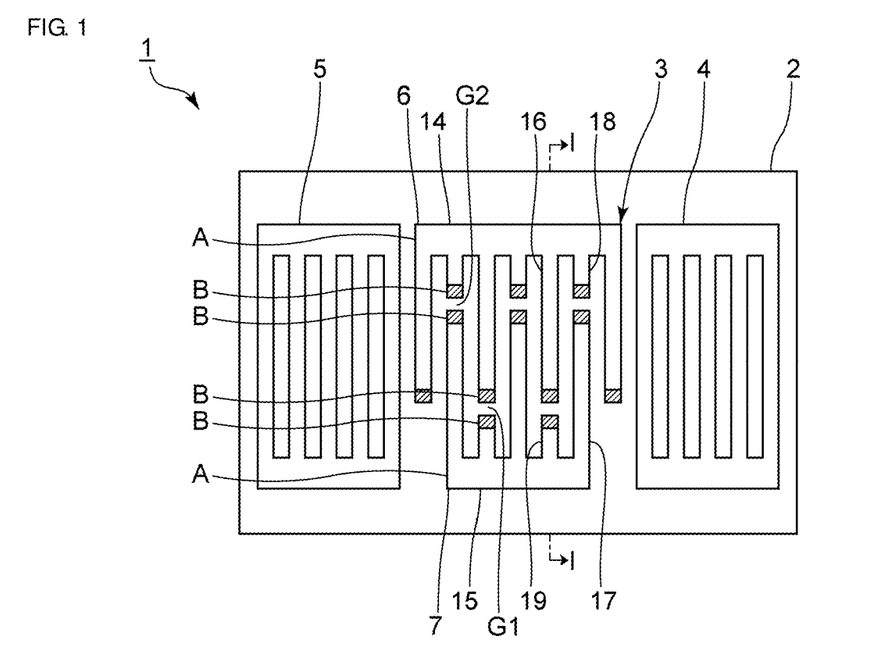
FIG. 1 is a plan view of an acoustic wave device according to a first preferred embodiment of the present invention.
Figure 2:
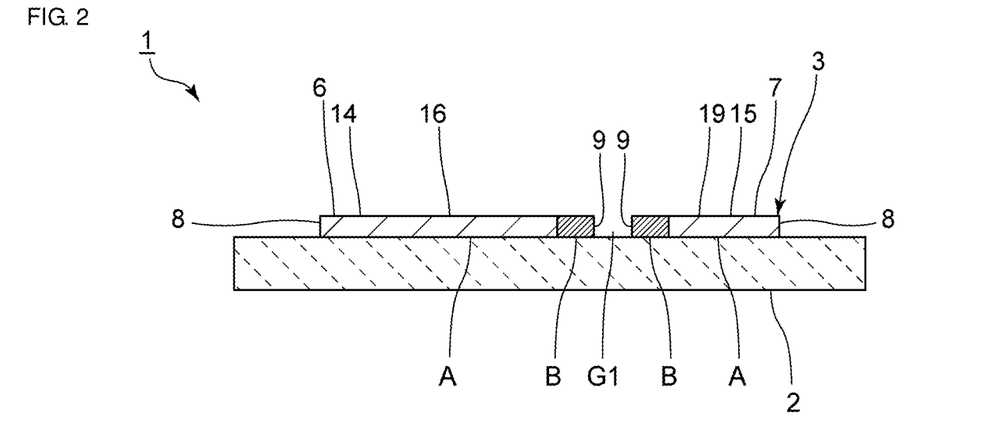
FIG. 2 is a sectional view taken along a line I-I in FIG. 1.

FIG. 1 is a plan view of an acoustic wave device according to a first preferred embodiment of the present invention. FIG. 2 is a sectional view taken along a line I-I in FIG. 1. A second portion, which will be described later, is indicated with hatching in FIG. 1. Note that the same applies to each of the plan views other than FIG. 1.

As illustrated in FIG. 1, an acoustic wave device 1 includes a piezoelectric substrate 2. The piezoelectric substrate includes only a piezoelectric layer in the present preferred embodiment. A piezoelectric single crystal or a piezoelectric ceramic may be appropriately used for the piezoelectric substrate 2. More specifically, lithium niobate, lithium tantalate, zinc oxide, aluminum nitride, quartz crystal ($SiO_2$), or sapphire may be used, for example, as the material of the piezoelectric substrate 2. Meanwhile, the piezoelectric substrate 2 may be a multilayer body including the piezoelectric layer.

An IDT electrode 3 is provided on the piezoelectric substrate 2. An acoustic wave is excited by applying AC voltage to the IDT electrode 3. A pair of reflectors 4 and 5 are provided on both sides of the IDT electrode 3 on the piezoelectric substrate 2 in an acoustic wave propagation direction. As described above, the acoustic wave device 1 of the present preferred embodiment is an acoustic wave resonator, for example. However, the acoustic wave device 1 according to preferred embodiments of the present invention may be a filter device including an acoustic wave resonator or the like, for example.

The IDT electrode 3 includes a first comb-shaped electrode 6 and a second comb-shaped electrode 7. The first comb-shaped electrode 6 includes a first busbar 14 and a plurality of first electrode fingers 16 each of which includes one end connected to the first busbar 14. The second comb-shaped electrode 7 includes a second busbar 15 and a plurality of second electrode fingers 17 each of which includes one end connected to the second busbar 15. The plurality of first electrode fingers 16 and the plurality of second electrode fingers 17 are interdigitated with each other. The plurality of first electrode fingers 16 face the second comb-shaped electrode 7 with a first gap G1 in between. The plurality of second electrode fingers 17 face the first comb-shaped electrode 6 with a second gap G2 in between.

The first comb-shaped electrode 6 includes a plurality of first dummy electrode fingers 18 each of which includes one end connected to the first busbar 14 and which face the plurality of second electrode fingers 17 with the second gap G2 in between. The second comb-shaped electrode 7 includes a plurality of second dummy electrode fingers 19 each of which includes one end connected to the second busbar 15 and which face the plurality of first electrode fingers 16 with the first gap G1 in between.

Here, the plurality of first electrode fingers 16 and the second comb-shaped electrode 7 each include first facing portions facing each other with the first gap G1 in between. The first facing portions of the plurality of first electrode fingers 16 are tip end portions of the plurality of first electrode fingers 16. The first facing portions of the second comb-shaped electrode 7 are tip end portions of the plurality of second dummy electrode fingers 19 in the present preferred embodiment.

Similarly, the plurality of second electrode fingers 17 and the first comb-shaped electrode 6 each include second facing portions facing each other with the second gap G2 in between. The second facing portions of the plurality of second electrode fingers are tip end portions of the plurality of second electrode fingers 17. The second facing portions of the first comb-shaped electrode 6 are tip end portions of the plurality of first dummy electrode fingers 18 in the present preferred embodiment. Note that it is not necessarily required that the IDT electrode 3 includes the first dummy electrode fingers 18 and the second dummy electrode fingers 19.

Each of the first comb-shaped electrode 6 and the second comb-shaped electrode 7 includes a main electrode layer. In the specification, the term "main electrode layer" refers to an electrode layer accounting for about 50% by weight or more. As illustrated in FIG. 2, the IDT electrode 3 includes a first portion A in which a main electrode layer 8 includes a first metal, and a second portion B in which a main electrode layer 9 includes a second metal. More specifically, as illustrated in FIG. 1, the second portion B of the IDT electrode 3 is the respective tip end portions of the plurality of first electrode fingers 16, the plurality of second electrode fingers 17, the plurality of first dummy electrode fingers 18, and the plurality of second dummy electrode fingers 19. As described above, in the present preferred embodiment, both of the first facing portions of the plurality of first electrode fingers 16 and the first facing portions of the second comb-shaped electrode 7, and both of the second facing portions of the plurality of second electrode fingers 17 and the second facing portions of the first comb-shaped electrode 6 are the second portion B.

Note that it is sufficient that the following is the second portion B: at least one of the first facing portions of the plurality of first electrode fingers 16 and the first facing portions of the second comb-shaped electrode 7, and at least one of the second facing portions of the plurality of second electrode fingers 17 and the second facing portions of the first comb-shaped electrode 6. Alternatively, it is sufficient that at least any of the first facing portions of the plurality of first electrode fingers 16, the first facing portions of the second comb-shaped electrode 7, the second facing portions of the plurality of second electrode fingers 17, and the second facing portions of the first comb-shaped electrode 6 are the second portion B.

The portion of the IDT electrode 3 other than the second portion B is the first portion A. More specifically, in the present preferred embodiment, the first portion A includes respective portions other than the tip end portions of the plurality of first electrode fingers 16, the plurality of second electrode fingers 17, the plurality of first dummy electrode fingers 18, and the plurality of second dummy electrode fingers 19, the first busbar 14, and the second busbar 15.

On the first busbar 14 and the second busbar 15 of the IDT electrode 3, an electrode layer including a wiring electrode to be connected to another device or the like may be provided. It should be noted that the electrode layer of the wiring electrode and the first busbar 14 and the second busbar 15 of the IDT electrode 3 in preferred embodiments of the present invention are different from each other.

In the acoustic wave device 1, the density of the second metal is higher than the density of the first metal, and a Young's modulus of the second metal is higher than a Young's modulus of the first metal. Note that, it is sufficient that the relationship between the first metal and the second metal satisfies at least one of the following: the density of the second metal is higher than the density of the first metal; the Young's modulus of the second metal is higher than the Young's modulus of the first metal. More specifically, for example, in a case that the first metal is Al, the second metal may be selected from any one of Ti, Cu, Mo, Cr, Ru, W, Pt, Ta, Co, Ni, Au, Mn, and the like. Further, the first metal and the second metal may be an alloy.

The IDT electrode 3 may be formed by, for example, a sputtering method or a vacuum deposition method. The second portion B may be formed after the first portion A has been formed, or the first portion A may be formed after the second portion B has been formed.

In the present preferred embodiment, each of the first portion A and the second portion B of the IDT electrode 3 includes a single metal layer. The reflectors 4 and 5 also include a single metal layer. Note that, the first portion A and the second portion B of the IDT electrode 3 and the reflectors 4 and 5 may be a laminated metal film in which a plurality of metal layers are laminated.

One of the unique features of the present preferred embodiment is the following configuration. 1) The IDT electrode 3 includes the first portion A in which the main electrode layer includes the first metal and the second portion B in which the main electrode layer includes the second metal. 2) At least one of the first facing portions of the plurality of first electrode fingers 16 and the first facing portions of the second comb-shaped electrode 7 and at least one of the second facing portions of the plurality of second electrode fingers 17 and the second facing portions of the first comb-shaped electrode 6 are the second portion B. 3) The portion of the IDT electrode 3 other than the second portion B is the first portion A. 4) The relationship between the first metal and the second metal satisfies at least one of the following: the density of the second metal is higher than the density of the first metal; and the Young's modulus of the second metal is higher than the Young's modulus of the first metal. With the configuration described above, IMD may be effectively reduced or prevented. This will be described below.

A second order nonlinear signal in an IMD signal is mainly generated in the first gap G1 and the second gap G2 in the IDT electrode 3. In the present preferred embodiment, the IDT electrode 3 itself includes the first portion A and the second portion B that include metals different from each other. The first portion A and the second portion B are continuously provided and are electrically connected. The first facing portions of the IDT electrode 3 facing with the gaps in between and the second facing portions of the IDT electrode 3 facing with the gaps in between are the second portion B, in which the main electrode layer 9 includes the second metal are heavier or have a higher Young's modulus out of the first metal and the second metal. That is, in a region in contact with each of the gaps in the IDT electrode 3, the second metal is heavier or has higher Young's modulus is directly disposed on the piezoelectric substrate 2. As described above, by providing the second metal that is heavier or has higher Young's modulus in the region in contact with each of the gaps at a position close to the piezoelectric substrate 2, it is possible to effectively reduce or prevent the distortion in each of the gaps and the second order nonlinear signal. Accordingly, IMD may be effectively reduced or prevented.

As in the present preferred embodiment, it is preferable that both of the first facing portions of the plurality of first electrode fingers 16 and the first facing portions of the second comb-shaped electrode 7 and defined by the second facing portions of the plurality of second electrode fingers 17 and the second facing portions of the first comb-shaped electrode 6 be the second portion B. With this configuration, the distortion in the first gap G1 and the second gap G2 may be further reduced or prevented, and IMD may be further reduced or prevented.

Figure 3:
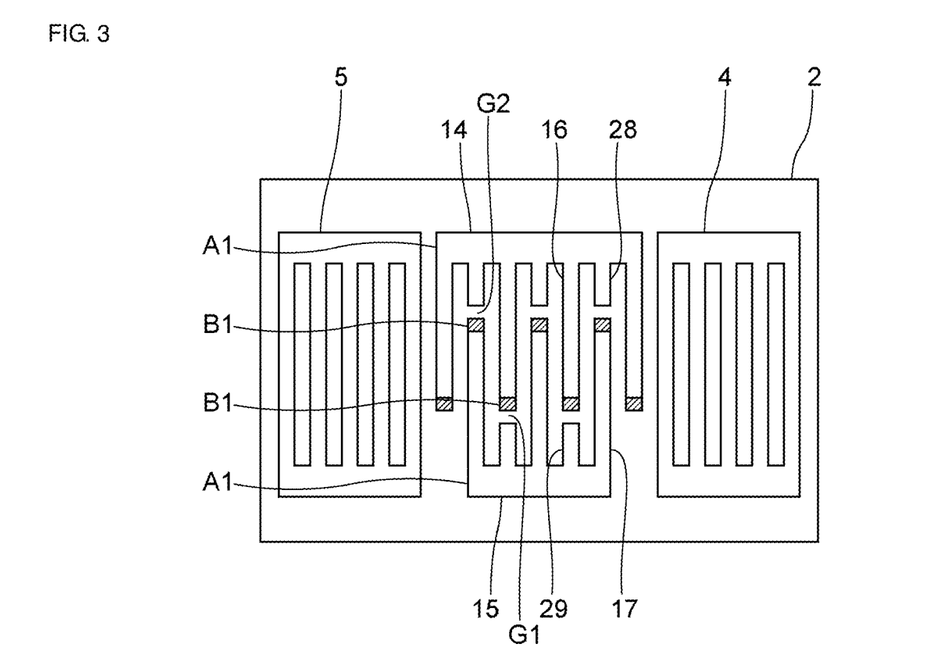
FIG. 3 is a plan view of an acoustic wave device according to a first modification of the first preferred embodiment of the present invention.
Figure 4:
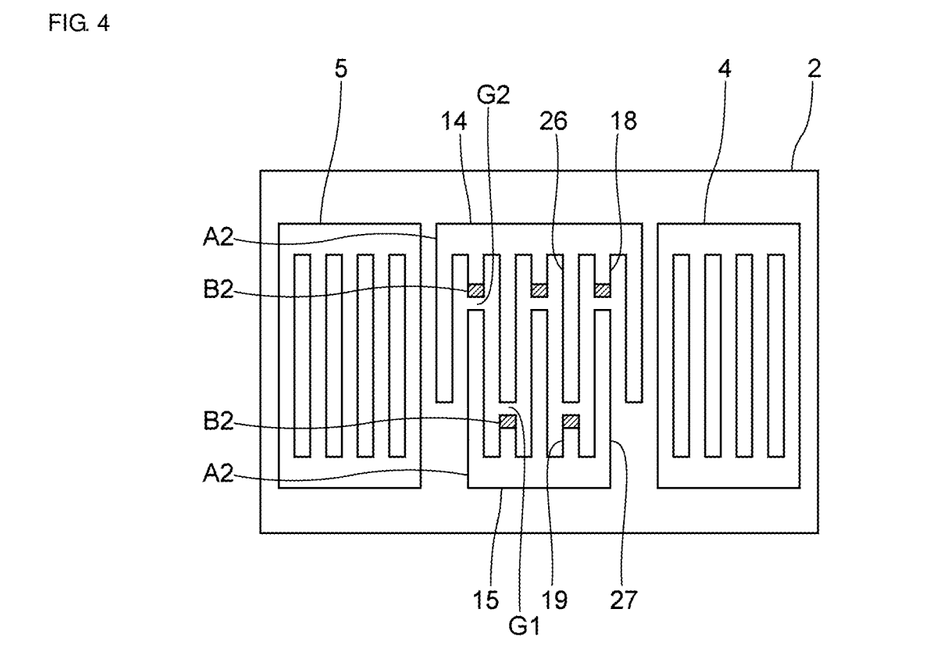
FIG. 4 is a plan view of an acoustic wave device according to a second modification of the first preferred embodiment of the present invention.

Referring to FIG. 3 and FIG. 4, a first modification and a second modification of the first preferred embodiment, which are different from the first preferred embodiment in the arrangement of the second portion, will be described. More specifically, in the first and second modifications, one of the first facing portions of the plurality of first electrode fingers and the first facing portions of the second comb-shaped electrode and one of the second facing portions of the plurality of second electrode fingers and the second facing portions of the first comb-shaped electrode are the second portion. In the first and second modifications, the distortion in the first gap and the second gap may effectively be reduced or prevented, and IMD may effectively be reduced or prevented.

FIG. 3 is a plan view of an acoustic wave device according to the first modification of the first preferred embodiment. FIG. 4 is a plan view of an acoustic wave device according to the second modification of the first preferred embodiment.

As illustrated in FIG. 3, in the first modification, a second portion B1 is the tip end portions of the plurality of first electrode fingers 16 and the tip end portions of the plurality of second electrode fingers 17. A first portion A1 includes respective portions other than the tip end portions of the plurality of first electrode fingers 16 and the plurality of second electrode fingers 17, a plurality of first dummy electrode fingers 28, a plurality of second dummy electrode fingers 29, the first busbar 14, and the second busbar 15. Meanwhile, the second portion B1 may be at least one of the tip end portions of the plurality of first electrode fingers 16 and the tip end portions of the plurality of second electrode fingers 17.

As illustrated in FIG. 4, in the second modification, a second portion B2 is the tip end portions of the plurality of first dummy electrode fingers 18 and the tip end portions of the plurality of second dummy electrode fingers 19. A first portion A2 includes respective portions other than the tip end portions of the plurality of first dummy electrode fingers 18 and the plurality of second dummy electrode fingers 19, a plurality of first electrode fingers 26, a plurality of second electrode fingers 27, the first busbar 14, and the second busbar 15.

Figure 5:
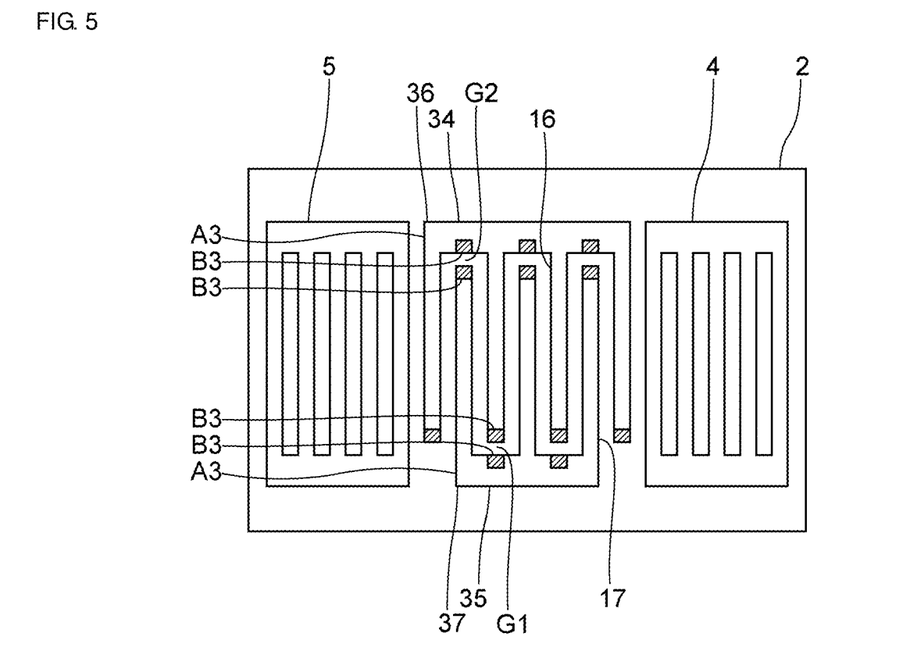
FIG. 5 is a plan view of an acoustic wave device according to a third modification of the first preferred embodiment of the present invention.
Figure 6:
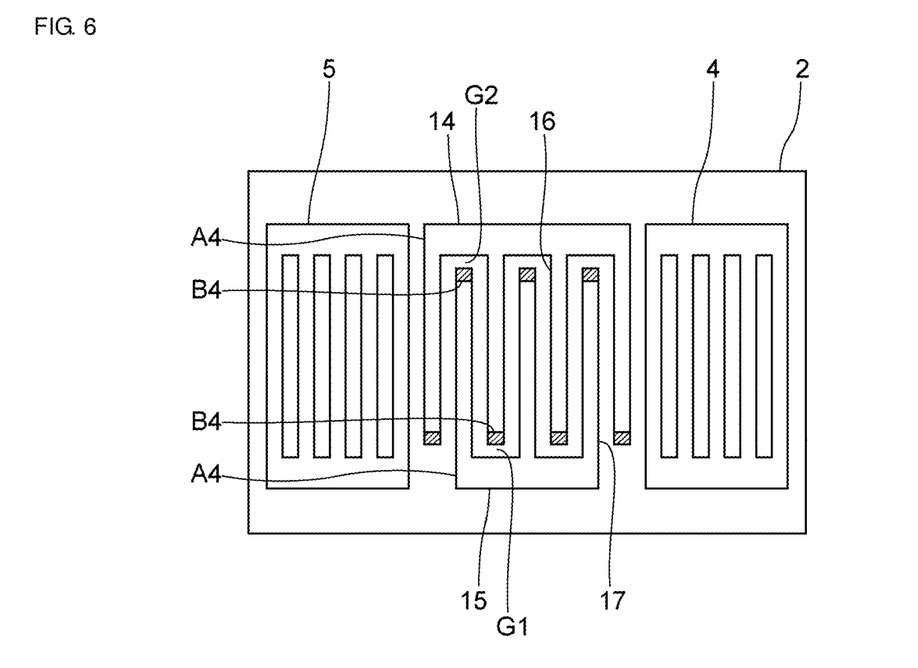
FIG. 6 is a plan view of an acoustic wave device according to a fourth modification of the first preferred embodiment of the present invention.
Figure 7:
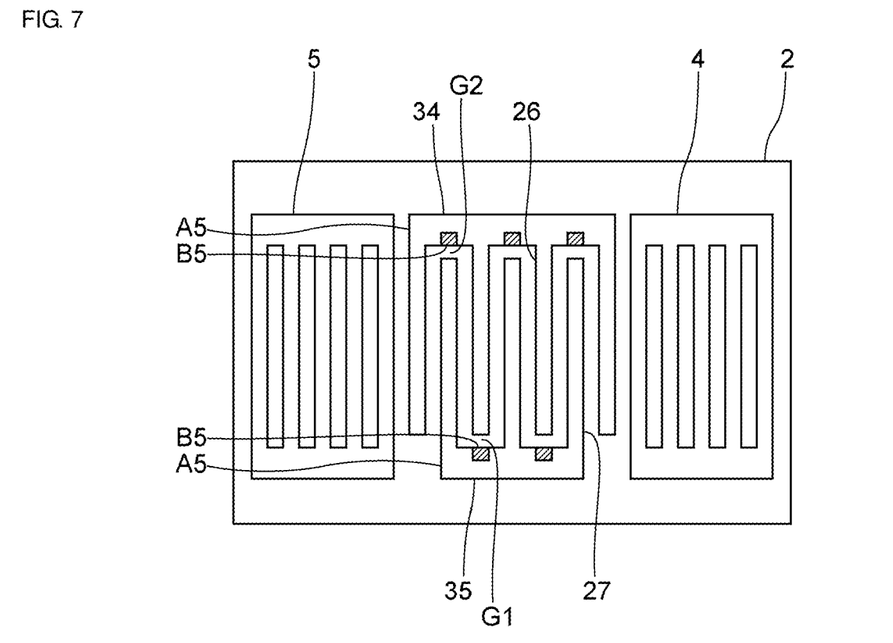
FIG. 7 is a plan view of an acoustic wave device according to a fifth modification of the first preferred embodiment of the present invention.

As described above, the IDT electrode may include neither the first dummy electrode fingers nor the second dummy electrode fingers. Hereinafter, a third modification to a fifth modification of the first preferred embodiment including neither the first dummy electrode fingers nor the second dummy electrode fingers will be described. In the third to fifth modifications, the distortion in the first gap and the second gap may effectively be reduced or prevented, and IMD may effectively be reduced or prevented.

As illustrated in FIG. 5, in the third modification, the plurality of first electrode fingers 16 and a second busbar 35 face each other with the first gap G1 in between. As described above, in the present modification, the first facing portions of a second comb-shaped electrode 37 are the portions of the second busbar 35 facing the respective first electrode fingers 16. The first facing portions of the plurality of first electrode fingers 16 are the tip end portions of the plurality of first electrode fingers 16.

Similarly, the plurality of second electrode fingers 17 and a first busbar 34 face each other with the second gap G2 in between. As described above, in the present modification, the second facing portions of a first comb-shaped electrode 36 are the portions of the first busbar 34 facing the respective second electrode fingers 17. The second facing portions of the plurality of second electrode fingers 17 are the tip end portions of the plurality of second electrode fingers 17. In the fourth and fifth modifications below, each of the first facing portions and each of the second facing portions are the same or substantially the same as those in the present modification.

In the present modification, both of the first facing portions of the plurality of first electrode fingers 16 and the first facing portions of the second comb-shaped electrode 37 and both of the second facing portions of the plurality of second electrode fingers 17 and the second facing portions of the first comb-shaped electrode 36 are a second portion B3. Further, the respective portions other than the tip end portions of the plurality of first electrode fingers 16 and the plurality of second electrode fingers 17 are a first portion A3. Further, the portion of the first busbar 34 other than the portions facing the respective second electrode fingers 17 and the portion of the second busbar 35 other than the portions facing the respective first electrode fingers 16 are the first portion A3.

As illustrated in FIG. 6, in the fourth modification, a second portion B4 is the tip end portions of the plurality of first electrode fingers 16 and the tip end portions of the plurality of second electrode fingers 17. A first portion A4 includes respective portions other than the tip end portions of the plurality of first electrode fingers 16 and the plurality of second electrode fingers 17, the first busbar 14, and the second busbar 15.

As illustrated in FIG. 7, in the fifth modification, the portions of the first busbar 34 facing the respective second electrode fingers 27 and the portions of the second busbar 35 facing the respective first electrode fingers 26 are a second portion B5. Further, the plurality of first electrode fingers 26 and the plurality of second electrode fingers 27 are a first portion A5. Further, the portion of the first busbar 34 other than the portions facing the respective second electrode fingers 27 and the portion of the second busbar 35 other than the portions facing the respective first electrode fingers 26 are the first portion A5.

Figure 8:
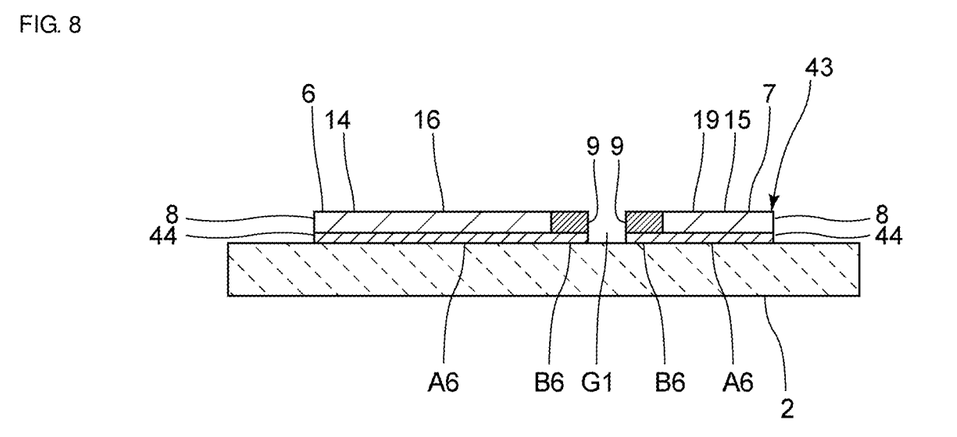
FIG. 8 is a sectional view of an acoustic wave device according to a sixth modification of the first preferred embodiment of the present invention and corresponding to a portion illustrated in FIG. 2.

As illustrated in FIG. 2, in the first preferred embodiment, the IDT electrode 3 includes a single metal layer. Note that the IDT electrode 3 may include a layer other than the main electrode layer. In a sixth modification of the first preferred embodiment illustrated in FIG. 8, an IDT electrode 43 includes an adhesion layer 44 between the main electrode layer 8 of a first portion A6 and the piezoelectric substrate 2 and between the main electrode layer 9 of a second portion B6 and the piezoelectric substrate 2. With the configuration above, it is possible to more reliably improve the adhesion of the IDT electrode and the piezoelectric substrate 2. Also in the present modification, the second metal that is heavier or has a higher Young's modulus is disposed at a position close to the piezoelectric substrate 2 in the region in contact with each gap in the IDT electrode 3. This makes it possible to effectively reduce or prevent the distortion in the first gap G1 and the second gap G2, and IMD may effectively be reduced or prevented as in the first preferred embodiment.

As described above, the main electrode layer of the second portion includes the second metal. Here, a metal layer of the second metal may extend to the first portion. In a seventh modification of the first preferred embodiment illustrated in FIG. 9, a metal layer 49 including the second metal extends from the second portion B and extends to the upper side of the main electrode layer 8 of a first portion A7. The metal layer 49 extending to the first portion A7 is integrally provided with the main electrode layer 9 of the second portion B. Note that a metal layer including the first metal may extend from the first portion A7 and reach the upper side of the main electrode layer 9 of the second portion B.

Figure 10:
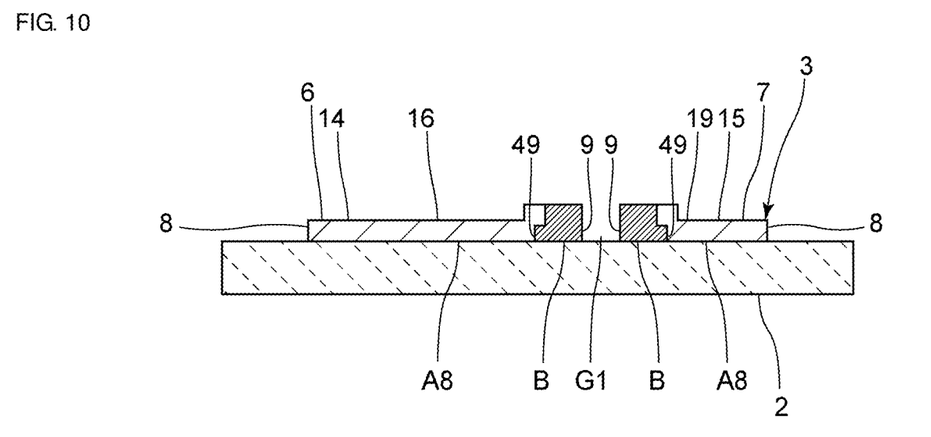
FIG. 10 is a sectional view of an acoustic wave device according to an eighth modification of the first preferred embodiment of the present invention and corresponding to the portion illustrated in FIG. 2.

Further, in an eighth modification of the first preferred embodiment illustrated in FIG. 10, the metal layer 49 including the second metal extends from the second portion B and reaches the portion between the main electrode layer 8 of a first portion A8 and the piezoelectric substrate 2. The metal layer 49 extending to the first portion A8 is integrally provided with the main electrode layer 9 of the second portion B.

Figure 9:
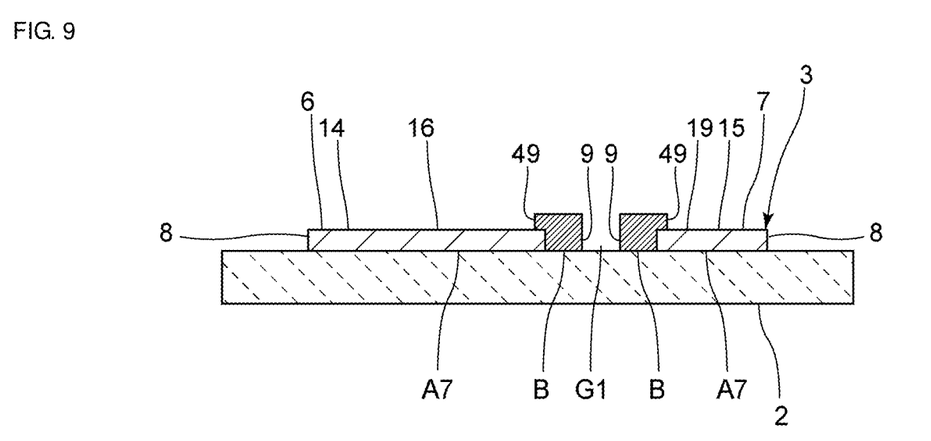
FIG. 9 is a sectional view of an acoustic wave device according to a seventh modification of the first preferred embodiment of the present invention and corresponding to the portion illustrated in FIG. 2.

In the seventh and eighth modifications, the distortion in the first gap G1 and the second gap G2 may effectively be reduced or prevented, and IMD may effectively be reduced or prevented as in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
 a piezoelectric substrate; and
 an IDT electrode on the piezoelectric substrate; wherein
 the IDT electrode includes a first comb-shaped electrode and a second comb-shaped electrode each of which includes a main electrode layer;
 the first comb-shaped electrode includes a first busbar and a plurality of first electrode fingers with one end connected to the first busbar, and the second comb-shaped electrode includes a second busbar and a plurality of second electrode fingers with one end connected to the second busbar and interdigitating with the plurality of first electrode fingers;
 the IDT electrode includes a first portion in which the main electrode layer includes a first metal and a second portion in which the main electrode layer includes a second metal;
 the plurality of first electrode fingers and the second comb-shaped electrode include first facing portions facing each other with a gap in between, and the plurality of second electrode fingers and the first comb-shaped electrode include second facing portions facing each other with a gap in between;
 the first facing portions of the plurality of first electrode fingers and the first facing portions of the second comb-shaped electrode are the second portion, and/or the second facing portions of the plurality of second electrode fingers and the second facing portions of the first comb-shaped electrode are the second portion;
 a portion of the IDT electrode other than the second portion is the first portion;
 the first portion and the second portion do not overlap one another in a plan view; and a density of the second metal is higher than a density of the first metal.

2. The acoustic wave device according to claim 1, wherein the IDT electrode includes a plurality of first dummy electrode fingers with one end connected to the first busbar and facing the plurality of second electrode fingers with a gap in between, and a plurality of second dummy electrode fingers with one end connected to the second busbar and facing the plurality of first electrode fingers with a gap in between.

3. The acoustic wave device according to claim 2, wherein tip end portions of the plurality of first dummy electrode fingers and tip end portions of the plurality of second dummy electrode fingers are the second portion.

4. The acoustic wave device according to claim 1, wherein at least one of tip end portions of the plurality of first electrode fingers and tip end portions of the plurality of second electrode fingers are the second portion.

5. The acoustic wave device according to claim 1, wherein both of the first facing portions of the plurality of first electrode fingers and the first facing portions of the second comb-shaped electrode and both of the second facing portions of the plurality of second electrode fingers and the second facing portions of the first comb-shaped electrode are the second portion.

6. The acoustic wave device according to claim 1, wherein the IDT electrode includes an adhesion layer between the main electrode layer and the piezoelectric substrate.

7. The acoustic wave device according to claim 1, wherein the first metal is Al, and the second metal is one of Ti, Cu, Mo, Cr, Ru, W, Pt, Ta, Co, Ni, Au, or Mn.

8. The acoustic wave device according to claim 1, wherein each of the first metal and the second metal includes a single metal layer.

9. The acoustic wave device according to claim 1, further comprising:
a pair of reflectors on both sides of the IDT electrode; wherein
each of the pair of reflectors includes a single metal layer.

10. An acoustic wave device, comprising:
a piezoelectric substrate; and
an IDT electrode on the piezoelectric substrate; wherein
the IDT electrode includes a first comb-shaped electrode and a second comb-shaped electrode each of which includes a main electrode layer;
the first comb-shaped electrode includes a first busbar and a plurality of first electrode fingers with one end connected to the first busbar, and the second comb-shaped electrode includes a second busbar and a plurality of second electrode fingers with one end connected to the second busbar and interdigitating with the plurality of first electrode fingers;
the IDT electrode includes a first portion in which the main electrode layer includes a first metal and a second portion in which the main electrode layer includes a second metal;
the plurality of first electrode fingers and the second comb-shaped electrode include first facing portions facing each other with a gap in between, and the plurality of second electrode fingers and the first comb-shaped electrode include second facing portions facing each other with a gap in between;
the first facing portions of the plurality of first electrode fingers and the first facing portions of the second comb-shaped electrode are the second portion, and/or the second facing portions of the plurality of second electrode fingers and the second facing portions of the first comb-shaped electrode are the second portion;
a portion of the IDT electrode other than the second portion is the first portion;
the first portion and the second portion do not overlap one another in a plan view; and
a Young's modulus of the second metal is higher than a Young's modulus of the first metal.

11. The acoustic wave device according to claim 10, wherein the IDT electrode includes a plurality of first dummy electrode fingers with one end connected to the first busbar and facing the plurality of second electrode fingers with a gap in between, and a plurality of second dummy electrode fingers with one end connected to the second busbar and facing the plurality of first electrode fingers with a gap in between.

12. The acoustic wave device according to claim 11, wherein tip end portions of the plurality of first dummy electrode fingers and tip end portions of the plurality of second dummy electrode fingers are the second portion.

13. The acoustic wave device according to claim 10, further comprising a pair of reflectors on both sides of the IDT electrode.

14. The acoustic wave device according to claim 13, wherein each of the pair of reflectors includes a single metal layer.

15. The acoustic wave device according to claim 10, wherein at least one of tip end portions of the plurality of first electrode fingers and tip end portions of the plurality of second electrode fingers are the second portion.

16. The acoustic wave device according to claim 10, wherein both of the first facing portions of the plurality of first electrode fingers and the first facing portions of the second comb-shaped electrode and both of the second facing portions of the plurality of second electrode fingers and the second facing portions of the first comb-shaped electrode are the second portion.

17. The acoustic wave device according to claim 10, wherein the IDT electrode includes an adhesion layer between the main electrode layer and the piezoelectric substrate.

18. The acoustic wave device according to claim 10, wherein the first metal is Al, and the second metal is one of Ti, Cu, Mo, Cr, Ru, W, Pt, Ta, Co, Ni, Au, or Mn.

19. The acoustic wave device according to claim 10, wherein each of the first metal and the second metal includes a single metal layer.

20. An acoustic wave device, comprising:
a piezoelectric substrate; and
an IDT electrode on the piezoelectric substrate; wherein
the IDT electrode includes a first comb-shaped electrode and a second comb-shaped electrode each of which includes a main electrode layer;
the first comb-shaped electrode includes a first busbar and a plurality of first electrode fingers with one end connected to the first busbar, and the second comb-shaped electrode includes a second busbar and a plurality of second electrode fingers with one end connected to the second busbar and interdigitating with the plurality of first electrode fingers;
the IDT electrode includes a first portion in which the main electrode layer includes a first metal and a second portion in which the main electrode layer includes a second metal;
the plurality of first electrode fingers and the second comb-shaped electrode include first facing portions facing each other with a gap in between, and the plurality of second electrode fingers and the first comb-shaped electrode include second facing portions facing each other with a gap in between;
at least one of: the first facing portions of the plurality of first electrode fingers and the second facing portions of the plurality of second electrode fingers is the second portion;
a portion of the IDT electrode other than the second portion is the first portion;
the first portion and the second portion do not overlap one another in a plan view; and
a density of the second metal is higher than a density of the first metal.

* * * * *